US006876016B2

United States Patent
Chan

(12) United States Patent
(10) Patent No.: US 6,876,016 B2
(45) Date of Patent: Apr. 5, 2005

(54) INVENTION FOR REDUCING DARK CURRENT OF CMOS IMAGE SENSOR WITH NEW STRUCTURE

(75) Inventor: Chien-Ling Chan, Hsin-Chu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 107 days.

(21) Appl. No.: 10/292,773

(22) Filed: Nov. 12, 2002

(65) Prior Publication Data
US 2003/0153113 A1 Aug. 14, 2003

Related U.S. Application Data

(62) Division of application No. 10/068,056, filed on Feb. 5, 2002, now Pat. No. 6,495,391.

(51) Int. Cl.[7] .............................................. H01L 27/148
(52) U.S. Cl. ....................................... 257/233; 257/228
(58) Field of Search ................................ 257/228–233, 257/461, 462

(56) References Cited

U.S. PATENT DOCUMENTS

| 5,625,210 A | 4/1997 | Lee et al. ................... 257/292 |
| 5,939,742 A | 8/1999 | Yiannoulos ................. 257/292 |
| 6,169,318 B1 * | 1/2001 | McGrath ..................... 257/445 |
| 6,171,882 B1 | 1/2001 | Chien et al. .................. 438/57 |
| 6,504,195 B2 * | 1/2003 | Guidash ..................... 257/292 |

* cited by examiner

Primary Examiner—Fetsum Abraham
(74) Attorney, Agent, or Firm—Duane Morris LLP

(57) ABSTRACT

A method is disclosed for forming an image sensor. In a semiconductor wafer containing a p-type region an n-type connection region is formed within the p-type region. An n-type photodiode region is formed in the p-type region connected to the connection region. A field oxide isolation region is formed, having a part that is over portions of the n-type connection region and the n-type photodiode region. This part of the field oxide region covers the area where these regions are connected and extends into these regions. The edges of this part of the field oxide region fall within these regions, while leaving a distance between these edges and pn junctions formed by the connection region and the p-type region and the n-type photodiode region and p-type region. A gate oxide is formed over regions not covered by field oxide. An extended gate structure is formed extending from above this part of the field oxide isolation region to a distance beyond the connection region so as to accommodate a channel of an n-channel MOSFET. The drain region of the n-channel MOSFET is formed, with the connection region acting as the source. A blanket transparent insulating layer is deposited.

36 Claims, 3 Drawing Sheets

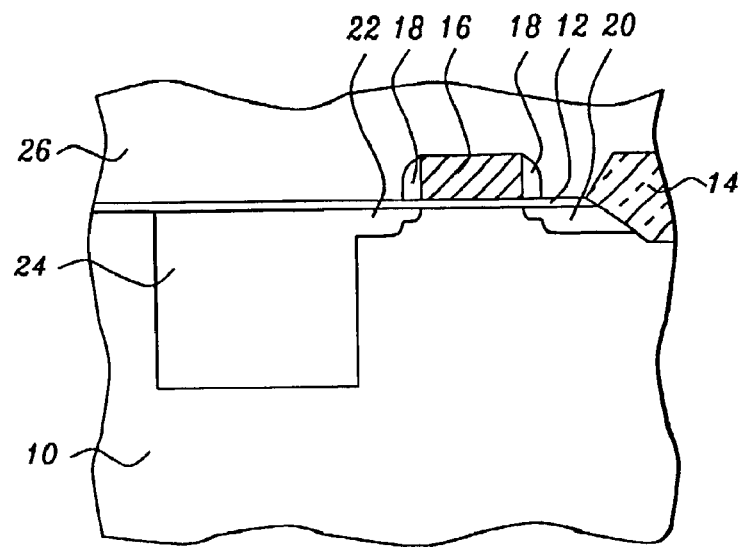
FIG. 1a – Prior Art
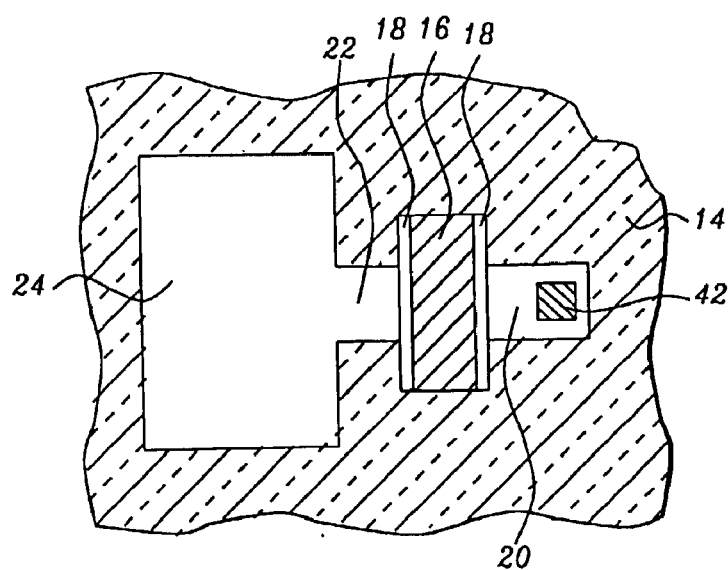
FIG. 1b – Prior Art

INVENTION FOR REDUCING DARK CURRENT OF CMOS IMAGE SENSOR WITH NEW STRUCTURE

This is a division of patent application Ser. No. 10/068, 056, filing date Feb. 5, 2002 U.S. Pat. No. 6,465,3911, Novel Invention For Reducing Dark Current Of Cmos Image Sensor With New Structure, assigned to the same assignee as the present invention.

BACKGROUND OF THE INVENTION (1) Field of the Invention

The present invention relates generally to image sensing devices and more particularly to image sensing devices built using CMOS fabricating processes.

(2) Description of Prior Art

State of the art CMOS image sensors often use junction photodiodes as light detection devices. Photons creating charge carriers within an effective region, about the p-n junction of the photodiode, give rise to current and can thus be detected. The effective region essentially consists of the depletion region and the regions that are within a minority carrier diffusion length of the depletion region on either side of the junction. However, charge carriers are also generated thermally and those generated within the effective region give rise to current even in the absence of light. To optimize the photodiode sensitivity it is necessary to minimize this dark current, which can be accomplished, by minimizing the thermal charge carrier generation rate. Imperfections and impurities give rise to increased thermal generation rates and these are more prevalent in the vicinity of surfaces and interfaces. This is because defects can arise from stresses found near surfaces and interfaces and also from process steps, such as ion implantation, that can cause damage near surfaces and interfaces. Also impurities can be introduced through surfaces during processing. Stress induced dark currents are particularly enhanced near corners and edges where the stress is enhanced. Particularly, excess leakage currents are prevalent in junctions of source/drain regions, arising from defects in the vicinity of gate structures where processing of the gate and spacers can induce damage near the silicon surface.

The structure of a photodiode and connected reset transistor of a conventional CMOS image sensor is shown in FIGS. 1A and 1B, which show a cross-section and top view, respectively. A p-type region, 10, is provided, which could be a p -well formed in an n-type semiconductor substrate, or a p-type semiconductor substrate. A field oxide, 14, is grown, delineating an active area which will contain the photodiode and n-channel MOSFET reset transistor of an image sensor and provide electrical isolation. A gate oxide, 12, is grown over the active area. Next the n-channel FET, which often has an LDD (lightly doped drain) structure, and the photodiode are formed. A polysilicon gate, 16, is formed dividing the available area into a smaller part that will contain a source/drain region and a larger part to contain a source/drain region and a photodiode. After a shallower, lower dose implant forming n-regions in both parts, self-aligned to the polysilicon gate electrode, oxide spacers, 18, are formed on the gate electrode. A deeper, higher dose implant is self-aligned to the oxide spacers to form n+-regions, in both parts, below, but abutting, the n-regions, which completes the formation of the LDD source, 22, and drain, 20, regions. A deeper implant is then performed to complete the n-type region of the photodiode, 24, which is continuous with the source, 22. Region 42 is a contact region. Finally a transparent insulating layer 26, such as BPTEOS, is deposited to passivate the structure.

Conventional photodiodes, such as depicted in FIGS. 1a and 1b, can be affected by imperfections that give rise to excessive dark current. Defects resulting from the ion implantation steps are not removed in subsequent processing steps, because after the source/drain regions are formed temperatures are kept low. This can result in excessive junction leakage, especially where the junction intercepts the surface. The vicinity of the spacer edge is especially susceptible to process induced imperfections, as is the vicinity of the bird's beak at the field oxide edge. If the photodiode depletion region or the source region of the reset transistor intersect the vicinity of the spacer edge or the field oxide edge, as occurs for the conventional diode, such as shown in FIGS. 1a and 1b, then excessive dark current can result. Since the source region of the reset transistor is continuous with the photodiode and they are thus electrically united, current leakage across the source junction is equivalent to leakage across the photodiode junction. In either case excessive leakage could result in what is called white pixels.

U.S. Pat. No. 5,939,742 to Yiannoulos discloses structures for MOSFET phototransistors, some of which place the photodiode under field oxide. This is preferable as it leads to reduced dark current. However, source regions of reset transistors are placed so that the junction is just below the field oxide edge, under the bird's beak, and the edge of the gate structure. These regions are most susceptible to process induced defects and consequently to excess junction leakage. Lee et al. in U.S. Pat. No. 5,625,210 discloses structures for active pixel sensors utilizing pinned photodiodes and combining CMOS and CCD technologies. The sources of leakage current, which is the concern of the invention are not eliminated in the photodiodes and reset transistors disclosed in the Lee invention. U.S. Pat. No. 6,169,318 to McGrath discloses a pixel design for a CMOS image sensor with improved quantum efficiency. The sources of leakage current, which is the concern of the invention are not eliminated in the photodiodes and reset transistors disclosed in the McGrath invention. U.S. Pat. No. 6,171,882 to Chien et al. teaches a method to prevent plasma damage to photodiodes by utilizing protective layers. This is not a structural modification and does not relate to the sources of leakage related to structural features of conventional photodiodes and reset transistors.

SUMMARY OF THE INVENTION

Accordingly, it is a primary objective of the invention to provide a method of forming an inherently low dark current photodiode appropriate for CMOS image sensors. A connection region placed substantially under the field oxide replaces the source region of the reset transistor. The junction of the connection region, being removed from the edges of the field oxide and gate structures, is relatively free of defects and thus exhibits a substantially reduced leakage current. Forming the connection region and the photodiode implants early in the process; before oxidation steps, polysilicon gate forming, and source/drain implant steps; allows for annealing of defects introduced by the implantation. Placing the photodiode substantially under the field oxide is also to be preferred. Thermal oxidation introduces relatively low stress in the silicon. Overlapping the photodiode implant region with the connection region under the field removes the photodiode depletion region from high stress corners at the field oxide edge.

A method is disclosed for forming an image sensor. In a semiconductor wafer containing a p-type region an n-type connection region is formed within the p-type region. An n-type photodiode region is formed in the p-type region connected to the connection region. A field oxide isolation region is formed, having a part that is over portions of the n-type connection region and the n-type photodiode region. This part of the field oxide region covers the area where these regions are connected and extends into these regions. The edges of this part of the field oxide region fall within these regions, while leaving a distance between these edges and pn functions formed by the connection region and the p-type region and the n-type photodiode region and p-type region. A gate oxide is formed over regions not covered by field oxide. An extended gate structure is formed extending from above this part of the field oxide isolation region to a distance beyond the connection region so as to accommodate a channel of an n-channel MOSFET. The drain region of the n-channel MOSFET is formed, with the connection region acting as the source. A blanket transparent insulating layer is deposited.

BRIEF DESCRIPTION OF THE DRAWINGS

In the accompanying drawings, forming a material part of this description, there is shown:

FIGS. 1A and 1B show the structure of a conventional photodiode and reset transistor in a CMOS image sensor.

DESCRIPTION OF THE PREFERRED EMBODIMENTS

Figure 2A:
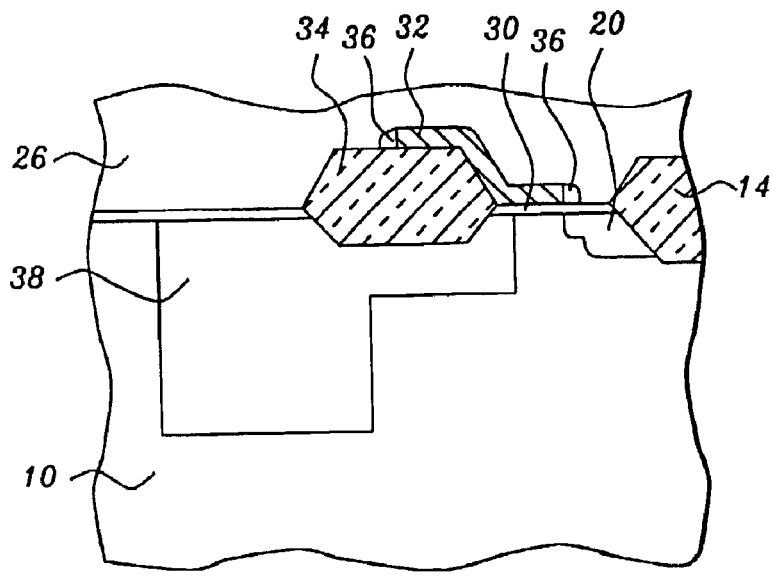
FIGS. 2A and 2B show the structure of a photodiode and reset transistor in a CMOS image sensor according to a preferred embodiment of this invention.
Figure 2B:
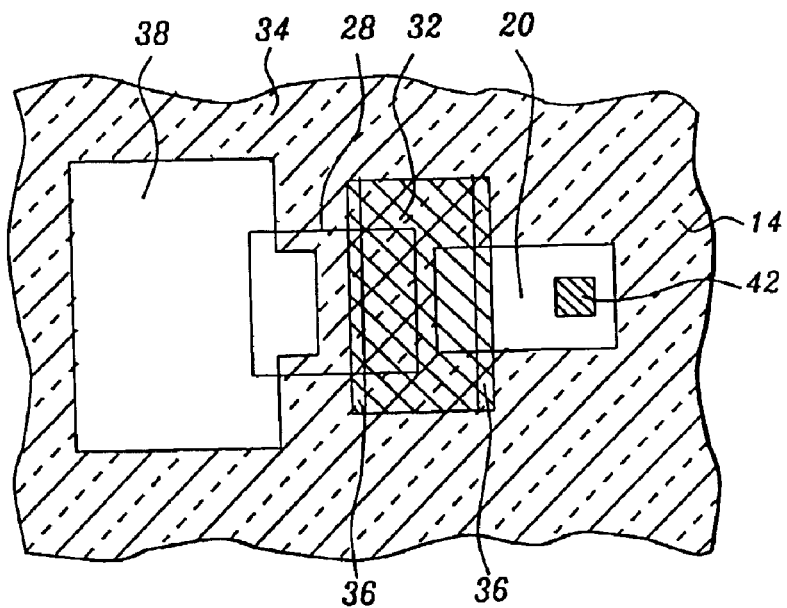

FIGS. 2a and 2b illustrate a structure of a reset transistor and photodiode of a CMOS image sensor formed according to preferred embodiments of the invention. A cross-section is shown in FIG. 2a and the layout is depicted in FIG. 2b. Referring to FIG. 2a, region 10 is a p-type region, which in preferred embodiments of the invention is a p-well or a p-type semiconductor substrate. Methods of forming a p-well are well known to those versed in the art. Prior to the growth of the field oxide, the implants to form the connection region, 28 and the photodiode, 38 are performed. Donor ions are implanted to form the n-type regions of the connection region and the photodiode. In preferred embodiments of the invention, the connection region is formed by implanting phosphorus ions a dose of between about 1E12 to about 5E14 per cm2 using energies between about 100 to 180 keV. Phosphorus ions are also preferably implanted to form the photodiode, to a dose of about 1E13 to about 5E15 per cm2 using energies between about 40 to 120 keV. Performing the connection region and photodiode implant at such an early stage of the process is an important part of the invention. This allows for extensive annealing of imperfections, such as defects arising from the ion implantation and during other processing steps; particularly during high temperature oxide growing steps.

Figure 3A:
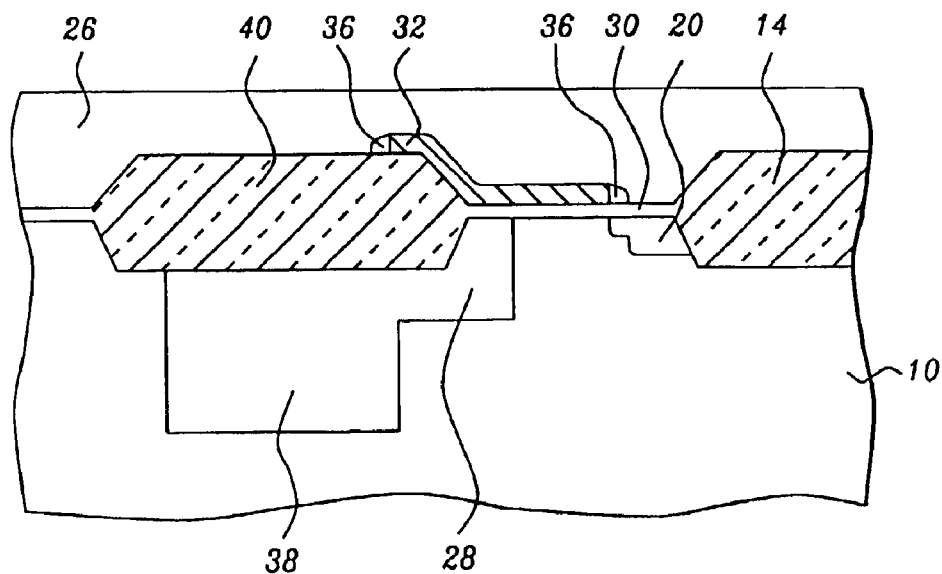
FIGS. 3A and 3B show the structure of a photodiode and reset transistor in a CMOS image sensor according to another preferred embodiment of this invention.
Figure 3B:
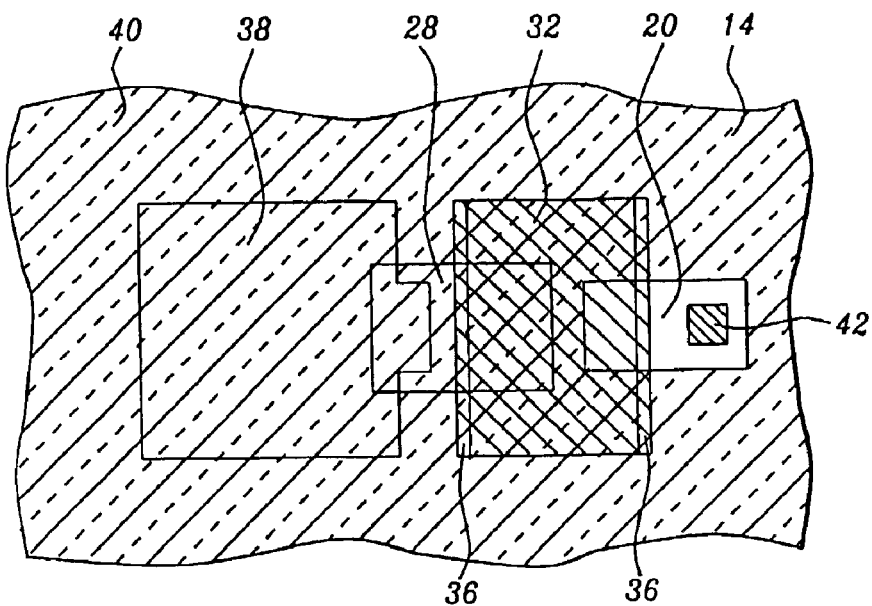

For preferred embodiments of the invention the field oxide, 14 and 34 is then grown as shown in FIGS. 2a and 2b. Field oxide is situated over parts of the connection region 28 and photodiode region 38, so that junctions of these regions that are near the surface are separated from edges of the field region. Overlapping the photodiode implant region with the connection region under the field removes the photodiode depletion region from high stress corners at the field oxide edge. The junctions of the connection region and the photodiode region, being removed from the edges of the field oxide and gate structures, are relatively free of defects and thus exhibit substantially reduced leakage current. If a junction is situated at a distance greater than about 0.5 microns from the edge of the field region or the gate structure significant excess currents are not induced. Forming the connection region and the photodiode implants early in the process; before oxidation steps and polysilicon gate forming; allows for annealing of defects introduced by the implantation. In other preferred embodiments of the invention the entire photodiode region is placed under field oxide, 40, as shown in FIGS. 3a and 3b. Placing the photodiode under the field oxide is to be preferred since the photodiode junction is completely removed from the silicon surface and thermal oxidation introduces relatively low stress in the silicon. In preferred embodiments of the invention the isolation region should be thermally grown oxide which introduces a minimum of stress in the underlying semiconductor. This means fewer imperfections and thus lower dark current. The localized oxidation isolation, LOCOS, method, and variations such as poly-buffered LOCOS, are used extensively in integrated circuit technology and limit the stress transmitted to the semiconductor. In LOCOS, a 20 to 60 nm pad oxide layer is first formed over the surface. A 100 to 200 nm silicon nitride layer is then formed. Both the pad oxide layer and silicon nitride layers are then removed, except for an active region containing the gate and drain regions of the image sensor FET. The remaining silicon nitride layer functions as an oxidation mask, preventing oxidation of the active region, which will contain a thin gate oxide. The underlying pad oxide layer reduces the stress that would exist if the silicon nitride layer were deposited directly on the semiconductor. Typically, the field oxide region is grown to a thickness of 500 to 900 nm by wet oxidation at temperatures of 900 to 1000 degree (C.) for 4 to 8 hours. This long high temperature oxidation step is most effective in annealing imperfection arising from previous processing, such as the connection region and photodiode implants. Additional details concerning LOCOS and other methods of forming thermal oxide isolation structures are well known to those skilled in the art.

Next the remaining silicon nitride and pad oxide are removed and, after cleaning the surface, a gate oxide, 30, is grown over the active region. Techniques for forming gate oxides are well known to those skilled in the art. Modern FETs are often fabricated in an LDD (lightly doped drain) structure, whose procedures are well known to those skilled in the art. For the image sensor reset transistor according to the invention the LDD structure is achieved only for the drain. A polysilicon or polycide gate electrode, 32, is formed extending from over the field oxide 34 to over the gate oxide so as to cover a channel length beyond the connecting region. The first of the LDD source/drain implants is then performed for the drain, self-aligned to the gate electrode, resulting in a shallow lightly doped region. This is normally a phosphorus implant with a dose of about 1E13 to 1E14 per cm2 and energy of about 40 to 70 keV. An insulating spacer, 36, often composed of TEOS, is formed on the drain side of the gate electrode whose width is about 75% to about 85% of the gate electrode height. The second of the LDD source/drain implants is then performed self aligned to the spacer, resulting in a deeper n+ region overlapping, but mainly below the first LDD source/drain implant. Typically the second LDD source/drain implant is arsenic with a dose of about 1E15 to 5E15 per cm2 and energy of about 35 to 65 keV. The region formed by both the first and second LDD implant is region 20. Region 42 is a contact region. Next a transparent insulating layer is deposited which preferably can be BPTEOS, LPTEOS or PEoxide.

While the invention has been particularly shown and described with reference to the preferred embodiments thereof, it will be understood by those skilled in the art that various changes in form and detail may be made without departing from the spirit and scope of the invention.

What is claimed is:

1. A structure for an image sensor comprising:
    a partially processed semiconductor wafer containing a p-type region;
    an n-type connection region within said p-type region;
    an n-type photodiode region within said p-type region connected to said connection region;
    a field oxide isolation region having a part that is over portions of said n-type connection region and n-type photodiode region covering the area where these regions are connected and extending into these regions, ending within these regions while leaving a distance between the edges of said part of field oxide isolation region and pn junctions formed by the connection region and the p-type region and the n-type photodiode region and p-type region;
    a gate oxide over regions not covered by field oxide;
    an extended gate structure extending from above said part of field oxide isolation region to a distance beyond said connection region to accommodate a channel of an n-channel MOSFET and forming the drain region of the n-channel MOSFET, and with the connection region acting as the source;
    a blanket transparent insulating layer.

2. The structure for an image sensor of claim 1 wherein said p-type region is a p-well or a p-type substrate.

3. The structure for an image sensor of claim 1 wherein said n-type connection region and n-type photodiode region are formed by ion implantation of donor ions.

4. The structure for an image sensor of claim 1 wherein said n-type connection region and n-type photodiode region are formed by implantation of phosphorous or arsenic ions.

5. The structure for an image sensor of claim 1 wherein said n-type connection region is formed by implantation of phosphorus to a dose of about 1E12 to about 5E14 per cm2 and an energy of about 100 to about 180 keV.

6. The structure for an image sensor of claim 1 wherein said n-type photodiode region is formed by implantation of phosphorus to a dose of about 1E13 to about 5E15 per cm2 and an energy of about 40 to about 120 keV.

7. The structure for an image sensor of claim 1 wherein said field oxide isolation region is formed by thermal oxidation.

8. The structure for an image sensor of claim 1 wherein said field oxide isolation region is formed using the LOCOS process or the poly-buffered LOCOS process.

9. The structure for an image sensor of claim 1 wherein the field oxide of said field oxide isolation region is grown to a thickness of about 500 to about 900 nm at a temperature of between about 900 to about 1000 degrees (C.).

10. The structure for an image sensor of claim 1 wherein said extended gate structure is composed of a polysilicon or polycide layer with an insulating spacer, that could be composed of TEOS, added onto the drain side of said polysilicon or polycide.

11. The structure for an image sensor of claim 1 wherein said distance between the edges of said part of field oxide isolation region and pn junctions formed by the connection region and the p-type region and the n-type photodiode region and p-type region is at least about 0.5 microns.

12. The structure for an image sensor of claim 1 wherein said drain region is formed by a double implant, the first donor implant being self-aligned to a polysilicon or polycide layer of said extended gate structure and could be phosphorous ions implanted to a dose of about 1E13 to 1E14 at energy of about 40 to 70 keV, and the second implant being sell-aligned to an insulating spacer added onto the drain side of said polysilicon or polycide and could be arsenic ions implanted to a dose of about 1E15 to 5E15 per cm2 at energy of about 35 to 65 keV.

13. The structure for an image sensor of claim 1 wherein said blanket insulating layer is composed of TEOS, BPTEOS or PEoxide.

14. A structure for forming an image sensor comprising:
    a partially processed semiconductor wafer containing a p-type region;
    an n-type connection region within said p-type region;
    an n-type photodiode region within said p-type region connected to said connection region;
    a field oxide isolation region having a part that is over portions of said n-type connection region and over all of said n-type photodiode region, covering the area where these regions are connected and extending into these regions, ending within the n-type connecting region while leaving a distance between the edge of said part of field oxide isolation region and pn junction formed by the connection region and the p-type region and extending beyond the n-type photodiode region so that there is a distance between the edge of said part of field oxide isolation region and pn junction formed by the n-type photodiode region and the p-type region;
    a gate oxide over regions not covered by filed oxide;
    an extended gate structure extending from above said part of filed oxide isolation region to a distance beyond said connection region to accommodate a channel of an n-channel MOSFET and forming the drain region of the n-channel MOSFET, and with the connection region acting as the source;
    a blanket transparent insulating layer.

15. The structure for an image sensor of claim 14 wherein said p-type region is a p-well or a p-type substrate.

16. The structure for an image sensor of claim 14 wherein said n-type connection region and n-type photodiode region are formed by ion implantation of donor ions.

17. The structure for an image sensor of claim 14 wherein said n-type connection region and n-type photodiode region are formed by implantation of phosphorous or arsenic ions.

18. The structure for an image sensor of claim 14 wherein said n-type connection region is formed by implantation of phosphorus to a dose of about 1E12 to about 1E14 per cm2 and an energy of about 100 to about 180 keV.

19. The structure for an image sensor of claim 14 wherein said n-type photodiode region is formed by implantation of phosphorus to a dose of about 1E13 to about 5E15 per cm2 and an energy of about 14 to about 120 keV.

20. The structure for an image sensor of claim 14 wherein said field oxide isolation region is formed by thermal oxidation.

21. The structure for an image sensor of claim 14 wherein said field oxide isolation region is formed using the LOCOS process or the poly-buffered LOCOS process.

22. The structure for an image sensor of claim 14 wherein the field oxide of said field oxide isolation region is grown to a thickness of about 500 to about 900 nm at a temperature of between about 900 to about 1000 degrees (C.).

23. The structure for an image sensor of claim 14 wherein said extended gate structure is composed of a polysilicon or polycide layer with an insulating spacer, that could be composed of TEOS, added onto the drain side of said polysilicon or polycide.

24. The structure for an image sensor of claim 14 wherein said distance between the edge of said part of field oxide isolation region and pn junction formed by the connection region and the p-type region and said distance between the edge of said part of field oxide isolation region and pn junction formed by the n-type photodiode region and the p-type region is at least about 0.5 microns.

25. The structure for an image sensor of claim 14 wherein said drain region is formed by a double implant, the first donor implant being self-aligned to a polysilicon or polycide layer of said extended gate structure and could be phosphorous ions implanted to a dose of about 1E13 to 1E14 at energy of about 70 to 70 keV, and the second implant being self-aligned to an insulating spacer added onto the drain side of said polysilicon or polycide and could be arsenic ions implanted to a dose of about 1E15 to 5E15 per cm2 at energy of about 35 to 65 keV.

26. The structure for an image sensor of claim 14 wherein said blanket insulating layer is composed of TEOS, BPTEOS or PEoxide.

27. An image sensor comprising:
   a transistor;
   a photodiode region disposed adjacent to the transistor;
   a connection region connected to the photodiode region, the connection region and the photodiode region forming a pn junction; and
   a field oxide region having a portion extending partially over the photodiode region, partially over the connection region and covering the pn junction;
   wherein the transistor includes an extended gate structure having a first portion disposed over the field oxide region.

28. The image sensor of claim 27, wherein the pnjunction is spaced from an edge of the field oxide region.

29. The image sensor of claim 27, wherein the extended gate structure has a second portion disposed over a gate oxide.

30. The image sensor of claim 27, wherein the connection region functions as a source or a drain.

31. The image sensor of claim 27, further comprising transparent insulating layer disposed over the photodiode region.

32. An image sensor comprising:
   a transistor;
   a photodiode region disposed adjacent to the transistor;
   a connection region connected to the photodiode region, the connection region and the photodiode region forming a pn junction; and
   a field oxide region having a portion extending entirely over the photodiode, partially over the connection region and covering the pn junction.

33. The image sensor of claim 32, wherein the pnjunction is spaced from an edge of the field oxide region.

34. The image sensor of claim 32, wherein the transistor includes an extended gate structure having a first portion disposed over the field oxide region and a second portion disposed over a gate oxide.

35. The image sensor of claim 32, wherein the connection region functions as a source or a drain.

36. The image sensor of claim 32, further comprising transparent insulating layer disposed over the photodiode region.

* * * * *

UNITED STATES PATENT AND TRADEMARK OFFICE
CERTIFICATE OF CORRECTION

PATENT NO. : 6,876,016 B2
APPLICATION NO. : 10/292773
DATED : April 5, 2005
INVENTOR(S) : Chien-Ling Chan It is certified that error appears in the above-identified patent and that said Letters Patent is hereby corrected as shown below:

Column 6, claim 12, line 9, delete "sell-aligned" and insert therefor --self-aligned--;

Column 6, claim 15, line 1; claim 16, line 1; claim 17, line 1; claim 18, line 1; claim 19, line 1; claim 20, line 1; claim 21, line 1; claim 22, line 1, after "for" insert --forming--;

Column 7, claim 23, line 1; claim 24, line 1; claim 25, line 1; claim 26, line 1; after "for" insert --forming--;

Column 8, claim 28, line 1; claim 33, line 1, delete "pnjunction" and insert therefor --pn junction--

Signed and Sealed this

Thirteenth Day of March, 2007

JON W. DUDAS
*Director of the United States Patent and Trademark Office*